United States Patent
Na

(10) Patent No.: US 11,626,175 B2
(45) Date of Patent: Apr. 11, 2023

(54) MEMORY SYSTEM AND OPERATING METHOD FOR DETERMINING TARGET MEMORY BLOCK FOR REFRESHING OPERATION

(71) Applicant: SK hynix Inc., Gyeonggi-do (KR)

(72) Inventor: Hyeong Ju Na, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/321,649

(22) Filed: May 17, 2021

(65) Prior Publication Data

US 2022/0223217 A1 Jul. 14, 2022

(30) Foreign Application Priority Data

Jan. 11, 2021 (KR) .................. 10-2021-0003096

(51) Int. Cl.
  *G11C 16/34* (2006.01)
  *G11C 16/26* (2006.01)
  *G11C 16/16* (2006.01)

(52) U.S. Cl.
  CPC .......... *G11C 16/3495* (2013.01); *G11C 16/16* (2013.01); *G11C 16/26* (2013.01); *G11C 16/3404* (2013.01)

(58) Field of Classification Search
  CPC ..... G11C 16/3495; G11C 16/16; G11C 16/26; G11C 16/3404
  See application file for complete search history.

(56) References Cited

U.S. PATENT DOCUMENTS

| 5,239,505 A | * | 8/1993 | Fazio | ................. | G11C 16/3431 |
| | | | | | 365/185.26 |
| 8,452,913 B2 | * | 5/2013 | Sudo | .................. | G06F 12/0246 |
| | | | | | 711/E12.001 |
| 2009/0172267 A1 | * | 7/2009 | Oribe | ................. | G11C 16/3418 |
| | | | | | 711/E12.008 |

FOREIGN PATENT DOCUMENTS

| KR | 10-2017-0078310 | 7/2017 |
| KR | 10-2020-0061217 | 6/2020 |

* cited by examiner

*Primary Examiner* — Vanthu T Nguyen
(74) *Attorney, Agent, or Firm* — IP & T Group LLP

(57) ABSTRACT

Various embodiments of the present disclosure generally relate to a memory system and an operating method thereof. According to the embodiments of the disclosed technology, the memory system may check first information indicating an execution state of a reference operation on each of the memory blocks during a preset target time period, may determine, based on the first information, at least one target memory block, among the plurality of memory blocks, as a target of a refresh operation of rewriting data stored in the target memory block and may execute a refresh operation on the target memory block.

12 Claims, 14 Drawing Sheets

FIG.6

INFO_1

| BLK | BLK_1 | BLK_2 | BLK_3 | ... | BLK_N-2 | BLK_N-1 | BLK_N |
|---|---|---|---|---|---|---|---|
| bit | 0 | 1 | 0 | | 0 | 1 | 0 |

0 : not executed
1 : executed

FIG.8

INFO_2

| | BLK | TOTAL_EW_CNT |
|---|---|---|
| TBL_ENTRY | BLK_1 | 30 |
| TBL_ENTRY | BLK_2 | 40 |
| TBL_ENTRY | BLK_3 | 20 |
| ... | ... | ... |
| TBL_ENTRY | BLK_N-2 | 25 |
| TBL_ENTRY | BLK_N-1 | 35 |
| TBL_ENTRY | BLK_N | 50 |

MEMORY SYSTEM AND OPERATING METHOD FOR DETERMINING TARGET MEMORY BLOCK FOR REFRESHING OPERATION

CROSS-REFERENCE TO RELATED APPLICATION

The present application claims priority under 35 U.S.C. § 119(a) to Korean Patent Application No. 10-2021-0003096 filed on Jan. 11, 2021, which is incorporated herein by reference in its entirety.

BACKGROUND

1. Technical Field

Various embodiments of the present disclosure generally relate to a memory system and an operating method thereof.

2. Related Art

A memory system includes a data storage device that stores data on the basis of a request from a host, such as a computer, servers, a smartphone, a tablet PC, or other electronic devices. The examples of the memory system span from a traditional magnetic-disk-based hard disk drive (HDD) to a semiconductor-based data storage device such as a solid state drive (SSD), a universal flash storage (UFS) device, or an embedded MMC (eMMC) device.

The memory system may further include a memory controller for controlling a memory device. The memory controller may receive a command from the host and, on the basis of the received command, may execute the command or control read/write/erase operations on the memory devices in the memory system. The memory controller may be used to execute firmware operations for performing a logical operation for controlling such operations.

Moreover, in order to secure reliability of data stored in the memory device, the memory system may execute a refresh operation of rewriting the stored data.

SUMMARY

Various embodiments of the present disclosure are directed to a memory system and an operating method thereof, capable of preventing an issue in which the lifetime of the memory system is shortened due to excessive refresh operations.

In one aspect, embodiments of the present disclosure may provide a memory system including: a memory device including a plurality of memory blocks; and a memory controller configured to communicate with the memory device, and control the memory device.

The memory controller may check first information indicating an execution state of a reference operation on each of the memory blocks during a preset target time period.

The memory controller may determine, based on the first information, at least one target memory block, among the plurality of memory blocks, as a target of a refresh operation of rewriting data stored in the target memory block.

The memory controller may execute a refresh operation on the target memory block.

The memory controller may check, for each of the plurality of memory blocks, second information indicating a total erase/write count for the plurality of memory blocks at a latest time point when the reference operation on each memory block has been executed, and may determine a sequence in which refresh operations on the target memory blocks are executed, based on the second information. The memory controller may execute the refresh operations on the target memory blocks according to the sequence.

In another aspect, embodiments of the present disclosure may provide a method for operating a memory system including a memory device including a plurality of memory blocks.

The method for operating a memory system may include checking first information indicating an execution state of a reference operation on each of the memory blocks during a preset target time period.

The method for operating a memory system may include determining, based on the first information, at least one target memory block, among the plurality of memory blocks, as a target of a refresh operation of rewriting data stored in the target memory block.

The method for operating a memory system may include executing a refresh operation on the target memory block.

The method for operating a memory system may further include checking, for each of the plurality of memory blocks, second information indicating a total erase/write count for the plurality of memory blocks at a latest time point when the reference operation on each memory block has been executed; and determining a sequence in which refresh operations on target memory blocks are executed, based on the second information. The refresh operation may be executed on the target memory block according to the sequence.

In another aspect, embodiments of the present disclosure may provide an operating method of a controller. The operating method of the controller may include controlling a nonvolatile memory device to perform an erase operation on one or more memory blocks during a target time period. The operating method of the controller may include controlling the nonvolatile memory device to perform a refresh operation on a target memory block among the memory blocks. The erase operation may not be performed on the target memory block during the target time period. Valid data may be stored in the target memory block during the target time period.

In another aspect, embodiments of the present disclosure may provide an operating method of a controller. The operating method of the controller may include controlling a nonvolatile memory device to perform a read operation on one or more memory blocks during target time period. The operating method of the controller may include controlling the nonvolatile memory device to perform a refresh operation on a target memory block among the memory blocks. The target memory block may be any of a memory block on which the read operation is not performed during the target time period or a memory block on which an error occurs while the read operation is performed during the target time period.

According to the embodiments of the disclosed technology, it is possible to prevent an issue in which the lifetime of a memory system is shortened due to excessive refresh operations.

BRIEF DESCRIPTION OF THE DRAWINGS

FIG. 6 is a diagram illustrating an example in which the first information illustrated in FIG. 5 is managed as a bitmap, based on the embodiment of the disclosed technology.

FIG. 8 is a diagram illustrating an example in which the second information illustrated in FIG. 7 is managed as a table, based on the embodiment of the disclosed technology.

DETAILED DESCRIPTION

Figure 1:
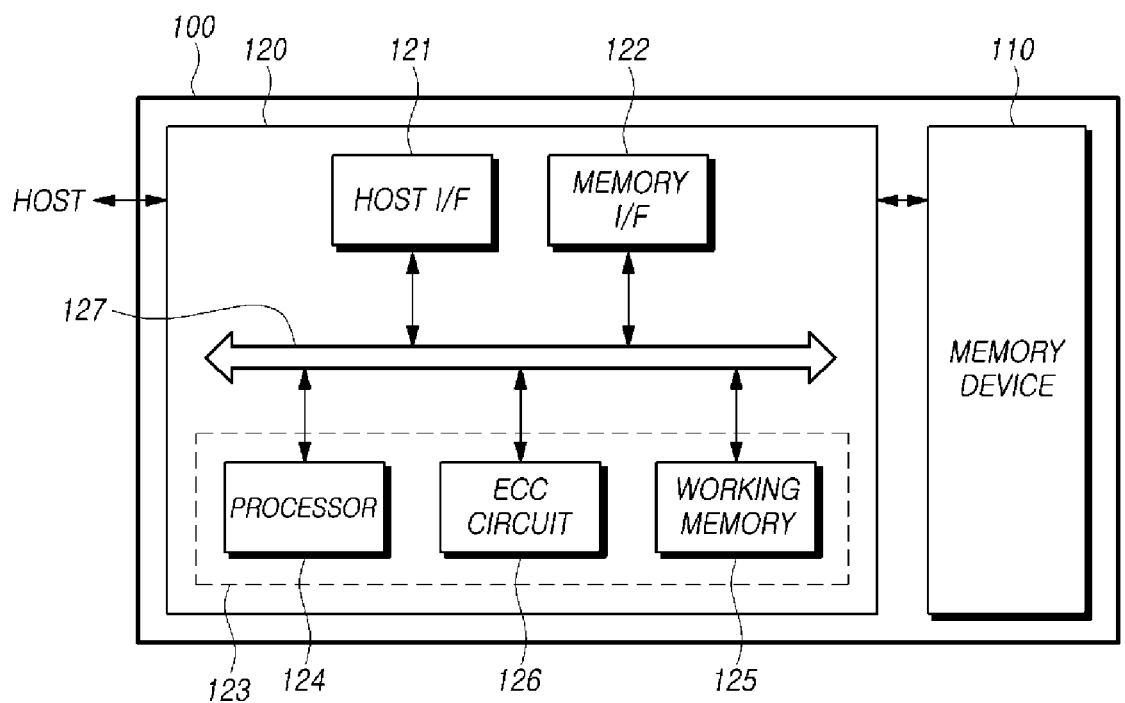
FIG. 1 is a schematic diagram illustrating a configuration of a memory system based on an embodiment of the disclosed technology.

Hereinafter, embodiments of the present disclosure are described in detail with reference to the accompanying drawings. Throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

Various embodiments of the present invention are described below in more detail with reference to the accompanying drawings. We note, however, that the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing methods herein.

When implemented in at least partially in software, the controllers, processors, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device.

FIG. 1 is a diagram illustrating the schematic configuration of a memory system 100 based on an embodiment of the disclosed technology.

In some implementations, the memory system 100 may include a memory device 110 configured to store data, and a memory controller 120 configured to control the memory device 110.

The memory device 110 may include multiple memory blocks each including a plurality of memory cells for storing data. The memory device 110 may be configured to operate in response to control signals received from the memory controller 120. Operations of the memory device 110 may include, for example, a read operation, a program operation (also referred to as a "write operation"), an erasure operation, and the like.

The memory cells in the memory device 110 are used to store data and may be arranged in a memory cell array. The memory cell array may be divided into memory blocks of memory cells and each block includes different pages of memory cells. In typical implementations of NAND flash memory devices, a page of memory cells is the smallest memory unit that can be programmed or written, and the data stored in memory cells can be erased at the block level.

In some implementations, the memory device 110 may be implemented as various types, such as a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), or a spin transfer torque random access memory (STT-RAM).

The memory device 110 may be implemented in a three-dimensional array structure. Some embodiments of the disclosed technology are applicable to any type of flash memory devices having an electric charge storage layer. In an implementation, the electric charge storage layer may be formed of a conductive material, and such an electric charge storage layer can be called a floating gate. In another implementation, the electric charge storage layer may be formed of an insulating material, and such a flash memory device can be called a charge trap flash (CTF).

The memory device 110 may be configured to receive a command and an address from the memory controller 120 to access an area of the memory cell array selected using the address. That is, the memory device 110 may perform an operation corresponding to the received command on a memory area of the memory device having a physical address corresponding to the received address from the memory controller 120.

In some implementations, the memory device 110 may perform a program operation, a read operation, an erasure operation, and the like. During the program operation, the memory device 110 may write data in the area selected by the address. During the read operation, the memory device 110 may read data from a memory area selected by the address. During the erasure operation, the memory device 110 may erase data stored in a memory area selected by the address.

The memory controller 120 may control write (program), read, erasure, and background operations that are performed on the memory device 110. The background operation may include, for example, operations that are implemented to optimize the overall performance of the memory device 110, such as a garbage collection (GC) operation, a wear leveling (WL) operation, and a bad block management (BBM) operation.

The memory controller 120 may control the operation of the memory device 110 at the request of a host. Alternatively, the memory controller 120 may control the operation of the memory device 110 even in absence of request from the host when it performs such background operations of the memory device.

The memory controller 120 and the host may be separate devices. In some implementations, the memory controller 120 and the host may be integrated and implemented as a single device. In the following description, the memory controller 120 and the host will be discussed as separate devices as an example.

Referring to FIG. 1, the memory controller 120 may include a memory interface 122, a control circuit 123, and a host interface 121.

The host interface 121 may be configured to provide an interface for communication with the host.

When receiving a command from the host HOST, the control circuit 123 may receive the command through the host interface 121 and may perform an operation of processing the received command.

The memory interface 122 may be directly or indirectly connected to the memory device 110 to provide an interface for communication with the memory device 110. That is, the memory interface 122 may be configured to provide the memory device 110 and the memory controller 120 with an interface for the memory controller 120 to perform memory operations on the memory device 110 based on control signals and instructions from the control circuit 123.

The control circuit 123 may be configured to control the operation of the memory device 110 through the memory controller 120. For example, the control circuit 123 may include a processor 124 and a working memory 125. The control circuit 123 may further include an error detection/correction circuit (ECC circuit) 126 and the like.

The processor 124 may control the overall operation of the memory controller 120. The processor 124 may perform a logical operation. The processor 124 may communicate with the host HOST through the host interface 121. The processor 124 may communicate with the memory device 110 through the memory interface 122.

The processor 124 may be used to perform operations associated with a flash translation layer (FTL) to effectively manage the memory operations on the memory system 100. The processor 124 may translate a logical block address (LBA) provided by the host into a physical block address (PBA) through the FTL. The FTL may receive the LBA and translate the LBA into the PBA by using a mapping table.

There are various address mapping methods which may be employed by the FTL, based on the mapping unit. Typical address mapping methods may include a page mapping method, a block mapping method, and a hybrid mapping method.

The processor 124 may be configured to randomize data received from the host to write the randomized data to the memory cell array. For example, the processor 124 may randomize data received from the host by using a randomizing seed. The randomized data is provided to the memory device 110 and written to the memory cell array.

The processor 124 may be configured to derandomize data received from the memory device 110 during a read operation. For example, the processor 124 may derandomize data received from the memory device 110 by using a derandomizing seed. The derandomized data may be output to the host HOST.

The processor 124 may execute firmware (FW) to control the operation of the memory controller 120. The processor 124 may control the overall operation of the memory controller 120 and, in order to perform a logical operation, may execute (drive) firmware loaded into the working memory 125 during booting.

The firmware refers to a program or software stored on a certain nonvolatile memory and is executed inside the memory system 100.

In some implementations, the firmware may include various functional layers. For example, the firmware may include at least one of a flash translation layer (FTL) configured to translate a logical address in the host HOST requests to a physical address of the memory device 110, a host interface layer (HIL) configured to interpret a command that the host HOST issues to a data storage device such as the memory system 100 and to deliver the command to the FTL, and a flash interface layer (FIL) configured to deliver a command issued by the FTL to the memory device 110.

For example, the firmware may be stored in the memory device 110, and then loaded into the working memory 125.

The working memory 125 may store firmware, program codes, commands, or pieces of data necessary to operate the memory controller 120. The working memory 125 may include, for example, at least one among a static RAM (SRAM), a dynamic RAM (DRAM), and a synchronous RAM (SDRAM) as a volatile memory.

The error detection/correction circuit 126 may be configured to detect and correct one or more erroneous bits in the data by using an error detection and correction code. In some implementations, the data that is subject to the error detection and correction may include data stored in the working memory 125, and data retrieved from the memory device 110.

The error detection/correction circuit 126 may be implemented to decode data by using the error correction code. The error detection/correction circuit 126 may be implemented by using various decoding schemes. For example, a decoder that performs nonsystematic code decoding or a decoder that performs systematic code decoding may be used.

In some implementations, the error detection/correction circuit 126 may detect one or more erroneous bits on a sector basis. That is, each piece of read data may include multiple sectors. In this present disclosure, a sector may refer to a data unit that is smaller than the read unit (e.g., page) of a flash memory. Sectors constituting each piece of read data may be mapped based on addresses.

In some implementations, the error detection/correction circuit 126 may calculate a bit error rate (BER) and determine whether the number of erroneous bits in the data is within the error correction capability sector by sector. For example, if the BER is higher than a reference value, the error detection/correction circuit 126 may determine that the erroneous bits in the corresponding sector are uncorrectable and the corresponding sector is marked "fail." If the BER is lower than or equals to the reference value, the error detection/correction circuit 126 may determine that the corresponding sector is correctable or the corresponding sector can be marked "pass."

The error detection/correction circuit 126 may perform error detection and correction operations successively on all read data. When a sector included in the read data is correctable, the error detection/correction circuit 126 may move on to the next sector to check whether an error correction operation is needed on the next sector. Upon completion of the error detection and correction operations on all the read data in this manner, the error detection/correction circuit 126 may acquire information as to which sector is deemed uncorrectable in the read data. The error detection/correction circuit 126 may provide such information (e.g., address of uncorrectable bits) to the processor 124.

The memory system 100 may also include a bus 127 to provide a channel between the constituent elements 121, 122, 124, 125, and 126 of the memory controller 120. The bus 127 may include, for example, a control bus for delivering various types of control signals and commands, and a data bus for delivering various types of data.

By way of example, FIG. 1 illustrates the above-mentioned constituent elements 121, 122, 124, 125, and 126 of the memory controller 120. It is noted that some of the constituent elements illustrated in the drawings may be omitted, or some of the above-mentioned constituent elements 121, 122, 124, 125, and 126 of the memory controller 120 may be integrated into a single element. In addition, in some implementations, one or more other constituent elements may be added to the above-mentioned constituent elements of the memory controller 120.

Figure 2:
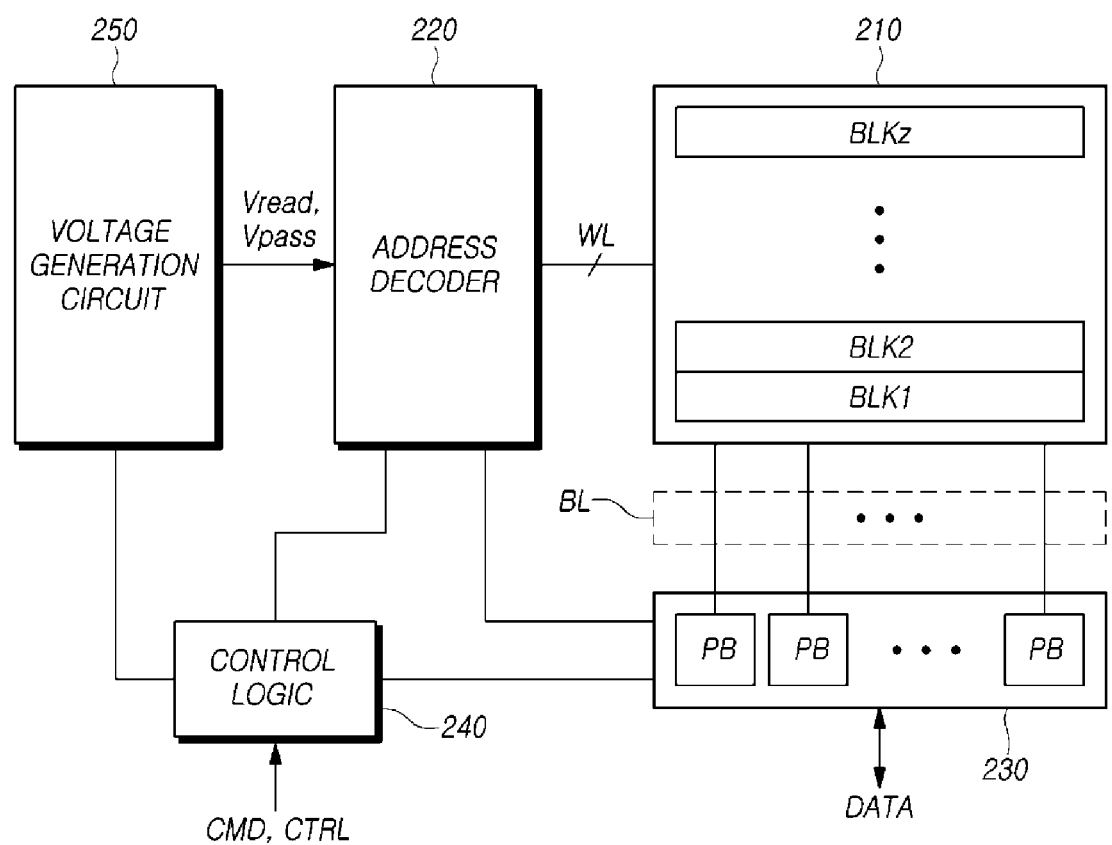
FIG. 2 is a block diagram schematically illustrating a memory device based on an embodiment of the disclosed technology.

FIG. 2 is a block diagram schematically illustrating a memory device 110 based on an embodiment of the disclosed technology.

In some implementations, the memory device 110 based on an embodiment of the disclosed technology may include a memory cell array 210, an address decoder 220, a read/write circuit 230, a control logic 240, and a voltage generation circuit 250.

The memory cell array 210 may include multiple memory blocks BLK1-BLKz, where z is a natural number equal to or greater than 2.

In the multiple memory blocks BLK1-BLKz, multiple word lines WL and multiple bit lines BL may be disposed in rows and columns, and multiple memory cells MC may be arranged.

The multiple memory blocks BLK1-BLKz may be connected to the address decoder 220 through the multiple word lines WL. The multiple memory blocks BLK1-BLKz may be connected to the read/write circuit 230 through the multiple bit lines BL.

Each of the multiple memory blocks BLK1-BLKz may include multiple memory cells. For example, the multiple memory cells are nonvolatile memory cells. In some implementations, such nonvolatile memory cells may be arranged in a vertical channel structure.

The memory cell array 210 may be configured as a memory cell array having a two-dimensional structure. In some implementations, the memory cell array 210 may be arranged in a three-dimensional structure.

Each of the multiple memory cells included in the memory cell array 210 may store at least one bit of data. For example, each of the multiple memory cells included in the memory cell array 210 may be a single-level cell (SLC) configured to store one bit of data. As another example, each of the multiple memory cells included in the memory cell array 210 may be a multi-level cell (MLC) configured to store two bits of data per memory cell. As another example, each of the multiple memory cells included in the memory cell array 210 may be a triple-level cell (TLC) configured to store three bits of data per memory cell. As another example, each of the multiple memory cells included in the memory cell array 210 may be a quad-level cell (QLC) configured to store four bits of data per memory cell. As another example, the memory cell array 210 may include multiple memory cells, each of which may be configured to store at least five bits of data per memory cell.

Referring to FIG. 2, the address decoder 220, the read/write circuit 230, the control logic 240, and the voltage generation circuit 250 may operate as peripheral circuits configured to drive the memory cell array 210.

The address decoder 220 may be connected to the memory cell array 210 through the multiple word lines WL.

The address decoder 220 may be configured to operate in response to command and control signals of the control logic 240.

The address decoder 220 may receive addresses through an input/output buffer inside the memory device 110. The address decoder 220 may be configured to decode a block address among the received addresses. The address decoder 220 may select at least one memory block based on the decoded block address.

The address decoder 220 may receive a read voltage Vread and a pass voltage Vpass from the voltage generation circuit 250.

The address decoder 220 may, during a read operation, apply the read voltage Vread to a selected word line WL inside a selected memory block and apply the pass voltage Vpass to the remaining non-selected word lines WL.

The address decoder 220 may apply a verification voltage generated by the voltage generation circuit 250 to a selected word line WL inside a selected memory block, during a program verification operation, and may apply the pass voltage Vpass to the remaining non-selected word lines WL.

The address decoder 220 may be configured to decode a column address among the received addresses. The address decoder 220 may transmit the decoded column address to the read/write circuit 230.

The memory device 110 may perform the read operation and the program operation page by page. Addresses received when the read operation and the program operation are requested may include at least one of a block address, a row address, and a column address.

The address decoder 220 may select one memory block and one word line based on the block address and the row address. The column address may be decoded by the address decoder 220 and provided to the read/write circuit 230.

The address decoder 220 may include at least one of a block decoder, a row decoder, a column decoder, and an address buffer.

The read/write circuit 230 may include multiple page buffers PB. The read/write circuit 230 may operate as a "read circuit" when the memory cell array 210 performs a read operation, and may operate as a "write circuit" when the memory cell array 210 performs a write operation.

The above-mentioned read/write circuit 230 is also referred to as a page buffer circuit including multiple page buffers PB, or a data register circuit. The read/write circuit 230 may include a data buffer that participates in a data processing function and, in some implementations, may further include a cache buffer for data caching.

The multiple page buffers PB may be connected to the memory cell array 210 through the multiple bit lines BL. In order to detect or sense the threshold voltage Vth of the memory cells during a read operation and a program verification operation, the multiple page buffers PB may continuously supply a sensing current to the bit lines BL connected to the memory cells to detect, at a sensing node, a change proportional to the amount of current that varies depending on the program state of a corresponding memory cell, and may hold or latch the corresponding voltage as sensing data.

The read/write circuit 230 may operate in response to page buffer control signals output from the control logic 240.

During a read operation, the read/write circuit 230 senses a voltage value of a memory cell and the voltage value is read out as data. The read/write circuit 230 temporarily stores the retrieved data, and outputs the data DATA to the input/output buffer of the memory device 110. In an embodiment, the read/write circuit 230 may include a column selection circuit, in addition to the page buffers PB or page registers.

The control logic 240 may be connected to the address decoder 220, the read/write circuit 230, and the voltage generation circuit 250. The control logic 240 may receive a command CMD and a control signal CTRL through the input/output buffer of the memory device 110.

The control logic 240 may be configured to control the overall operation of the memory device 110 in response to the control signal CTRL. The control logic 240 may output a control signal for adjusting the voltage level of sensing nodes of multiple page buffers PB to a pre-charge voltage level.

The control logic 240 may control the read/write circuit 230 to perform a read operation in the memory cell array 210. The voltage generation circuit 250 may generate a read voltage Vread and a pass voltage Vpass, which are used during the read operation, in response to a voltage generation circuit control signal output from the control logic 240.

A memory block BLK included in the memory device 110 may include multiple pages PG. In some implementations, a plurality of memory cells arranged in columns form memory cell strings, and a plurality of memory cells arranged in rows form memory blocks. Each of the multiple pages PG is coupled to one of word lines WL, and each of the memory cell strings STR is coupled to one of bit lines BL.

In the memory block BLK, multiple word lines WL and multiple bit lines BL may be arranged in rows and columns. For example, each of the multiple word lines WL may be arranged in the row direction, and each of the multiple bit lines BL may be arranged in the column direction. As another example, each of the multiple word lines WL may be arranged in the column direction, and each of the multiple bit lines BL may be arranged in the row direction.

In some implementations, the multiple word lines WL and the multiple bit lines BL may intersect with each other, thereby addressing a single memory cell in the array of multiple memory cells MC. In some implementations, each memory cell MC may include a transistor TR that includes a material layer that can hold an electrical charge.

For example, the transistor TR arranged in each memory cell MC may include a drain, a source, and a gate. The drain (or source) of the transistor TR may be connected to the corresponding bit line BL directly or via another transistor TR. The source (or drain) of the transistor TR may be connected to the source line (which may be the ground) directly or via another transistor TR. The gate of the transistor TR may include a floating gate (FG) surrounded by an insulator, and a control gate (CG) to which a gate voltage is applied from a word line WL.

In each of the multiple memory blocks BLK1-BLKz, a first selection line (also referred to as a source selection line or a drain selection line) may be additionally arranged outside the first outermost word line, which is closer to the read/write circuit 230 among two outermost word lines, and a second selection line (also referred to as a drain selection line or a source selection line) may be additionally arranged outside the other second outermost word line.

In some implementations, at least one dummy word line may be additionally arranged between the first outermost word line and the first selection line. In addition, at least one dummy word line may be additionally arranged between the second outermost word line and the second selection line.

A read operation and a program operation (write operation) of the memory block may be performed page by page, and an erasure operation may be performed memory block by memory block.

Figure 3:
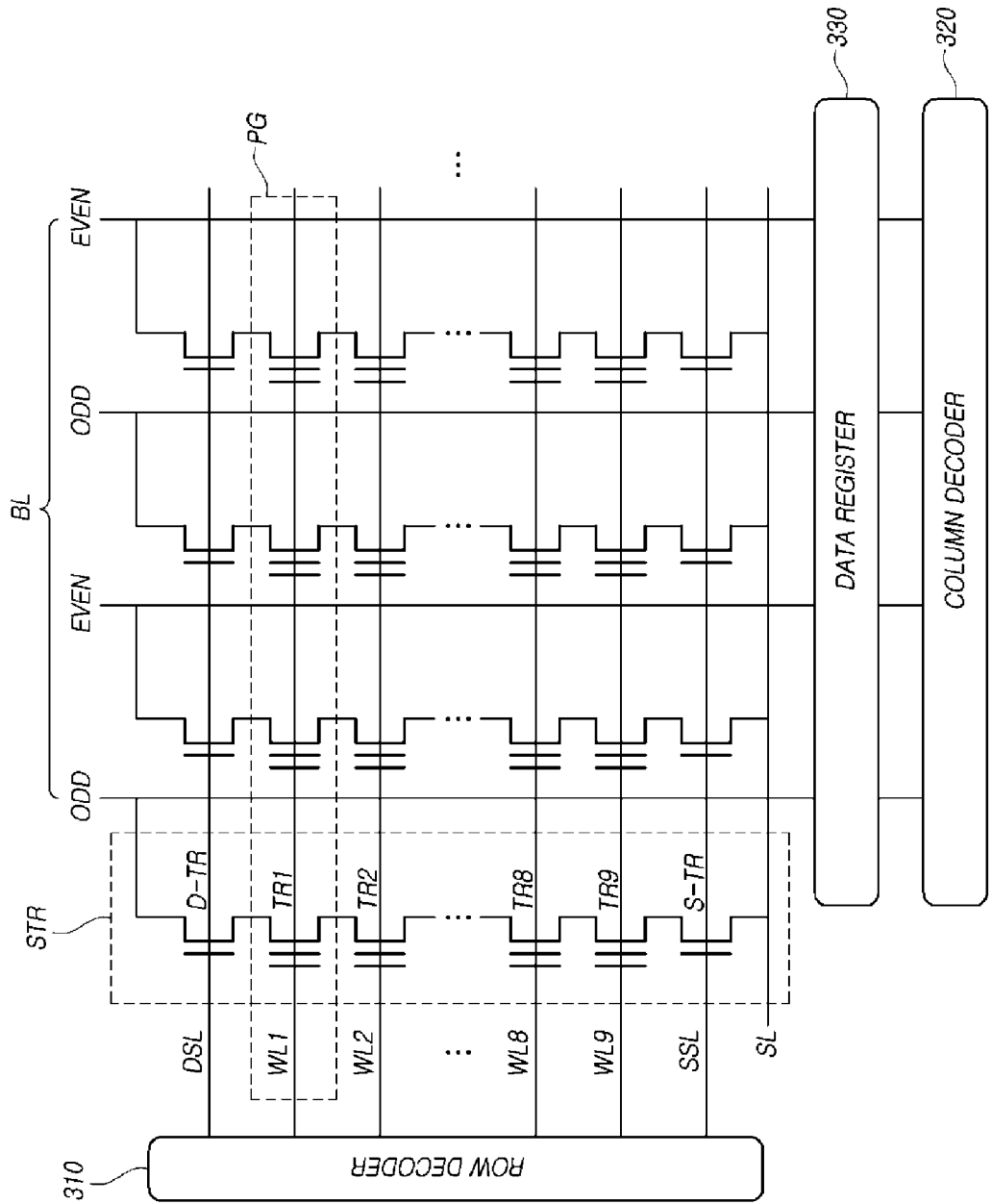
FIG. 3 is a diagram illustrating a structure of word lines and bit lines of a memory device based on an embodiment of the disclosed technology.

FIG. 3 is a diagram illustrating a structure of word lines WL and bit lines BL of a memory device 110 based on an embodiment of the disclosed technology.

Referring to FIG. 3, the memory device 110 has a core area in which memory cells MC are arranged, and an auxiliary area (the remaining area other than the core area) to include circuitry that is used to perform the operations of the memory cell array 210.

In the core area, a certain number of memory cells arranged in one direction can be called "page" PG, and a certain number of memory cells that are coupled in series can be called "memory cell string" STR.

The word lines WL1-WL9 may be connected to a row decoder 310. The bit lines BL may be connected to a column decoder 320. A data register 330, which corresponds to the read/write circuit 230 of FIG. 2, may exist between the multiple bit lines BL and the column decoder 320.

The multiple word lines WL1-WL9 may correspond to multiple pages PG.

For example, each of the multiple word lines WL1-WL9 may correspond to one page PG as illustrated in FIG. 3. When each of the multiple word lines WL1-WL9 has a large size, each of the multiple word lines WL1-WL9 may correspond to at least two (e.g., two or four) pages PG. Each page PG is the smallest unit in a program operation and a read operation, and all memory cells MC within the same page PG may perform simultaneous operations when conducting a program operation and a read operation.

The multiple bit lines BL may be connected to the column decoder 320. In some implementations, the multiple bit lines BL may be divided into odd-numbered bit lines BL and even-numbered bit lines BL such that a pair of odd-numbered bit line and even-numbered bit line is coupled in common to a column decoder 320.

In accessing a memory cell MC, the row decoder 310 and the column decoder 320 are used to locate a desired memory cell based on the address.

In some implementations, the data register 330 plays an important role because all data processing by the memory device 110, including program and read operations, occurs via the data register 330. If data processing by the data register 330 is delayed, all of the other areas need to wait until the data register 330 finishes the data processing, degrading the overall performance of the memory device 110.

Referring to the example illustrated in FIG. 3, in one memory cell string STR, multiple transistors TR1-TR9 may be connected to multiple word lines WL1-WL9, respectively. In some implementations, the multiple transistors TR1-TR9 correspond to memory cells MC. In this example, the multiple transistors TR1-TR9 include control gates CG and floating gates FG.

The multiple word lines WL1-WL9 include two outermost word lines WL1 and WL9. A first selection line DSL may be additionally arranged outside the first outermost word line WL1, which is closer to the data register 330 and has a shorter signal path compared to the other outermost word line WL9. A second selection line SSL may be additionally arranged outside the other second outermost word line WL9.

The first selection transistor D-TR, which is controlled to turn on/off by the first selection line DSL, has a gate electrode connected to the first selection line DSL, but includes no floating gate FG. The second selection transistor S-TR, which is controlled to turn on/off by the second selection line SSL, has a gate electrode connected to the second selection line SSL, but includes no floating gate FG.

The first selection transistor D-TR is used as a switch circuit that connects the corresponding memory cell string STR to the data register 330. The second selection transistor S-TR is used as a switch that connects the corresponding memory cell string STR to the source line SL. That is, the first selection transistor D-TR and the second selection transistor S-TR can be used to enable or disable the corresponding memory cell string STR.

In some implementations, the memory system 100 applies a predetermined turn-on voltage Vcc to the gate electrode of the first selection transistor D-TR, thereby turning on the first selection transistor D-TR, and applies a predetermined turn-off voltage (e.g., 0V) to the gate electrode of the second selection transistor S-TR, thereby turning off the second selection transistor S-TR.

The memory system 100 turns on both of the first and second selection transistors D-TR and S-TR during a read operation or a verification operation. Accordingly, during a read operation or a verification operation, an electric current may flow through the corresponding memory cell string STR and drain to the source line SL, which corresponds to the ground, such that the voltage level of the bit line BL can be measured. However, during a read operation, there may be a time difference in the on/off timing between the first selection transistor D-TR and the second selection transistor S-TR.

The memory system 100 may apply a predetermined voltage (e.g., +20V) to the substrate through a source line SL during an erasure operation. The memory system 100 applies a certain voltage to allow both the first selection transistor D-TR and the second selection transistor S-TR to float during an erasure operation. As a result, the applied erasure voltage can remove electrical charges from the floating gates FG of the selected memory cells.

Figure 4:
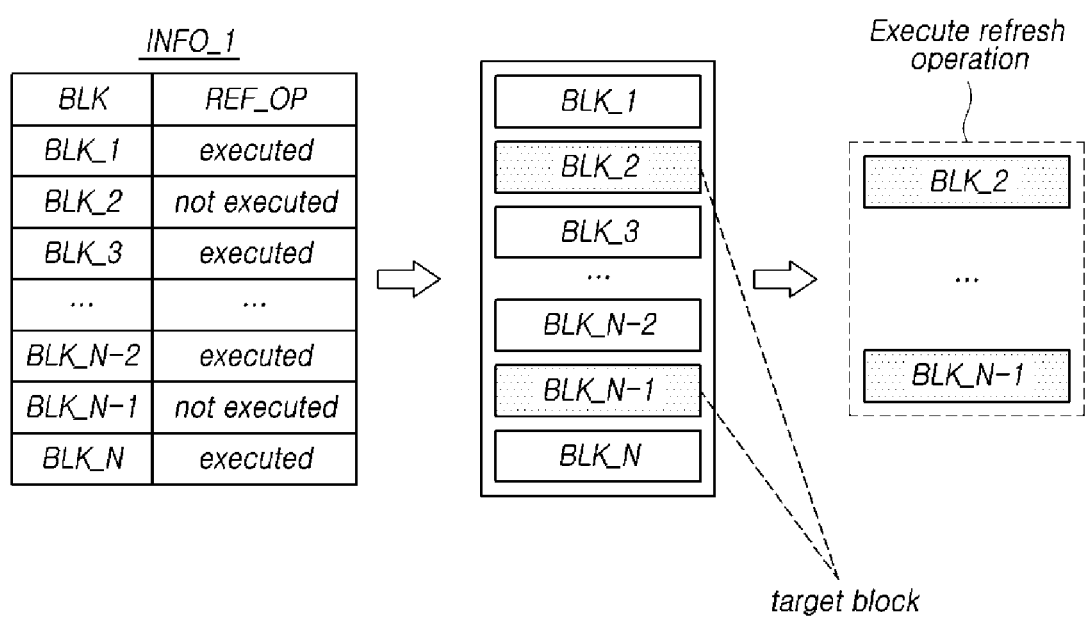
FIG. 4 is a diagram illustrating a schematic operation of the memory system based on the embodiment of the disclosed technology.

FIG. 4 is a diagram illustrating a schematic operation of the memory system 100 based on the embodiment of the disclosed technology.

Referring to FIG. 4, the memory controller 120 of the memory system 100 may check first information INFO_1.

The first information INFO_1 is information indicating an execution state of a reference operation REF_OP on each of a plurality of memory blocks BLK_1, BLK_2, BLK_3, . . . , BLK_N−2, BLK_N−1 and BLK_N included in the memory device 110 of the memory system 100 during a preset target time period.

The target time period may be arbitrarily determined by the memory controller 120, and the reference operation REF_OP may be a specific operation executable by the memory controller 120.

The execution state of the reference operation REF_OP on each memory block may include at least one among, for example, 1) whether the reference operation REF_OP on the memory block has ever been executed, 2) whether an error has occurred while the reference operation REF_OP on the memory block is executed and 3) whether a recovery operation is performed on an error occurred while the reference operation REF_OP on the memory block is executed.

Hereinafter, as an example, a description will be made for a case in which the first information INFO_1 indicates whether the reference operation REF_OP on each memory block has ever been executed during the target time period.

For example, in FIG. 4, the first information INFO_1 indicates that 1) the reference operation REF_OP has been executed on the first memory block BLK_1 during the target time period, 2) the reference operation REF_OP has not been executed on the second memory block BLK_2 during the target time period, 3) the reference operation REF_OP has been executed on the third memory block BLK_3 during the target time period, 4) the reference operation REF_OP has been executed on the (N−2)ˆth memory block BLK_N−2 during the target time period, 5) the reference operation REF_OP has not been executed on the (N−1)ˆth memory block BLK_N−1 during the target time period, and 6) the reference operation REF_OP has been executed on the Nˆth memory block BLK_N during the target time period. A value of the first information INFO_1 may vary depending on whether the reference operation REF_OP on each memory block has been executed during the target time period.

The memory controller 120 may determine at least one target memory block as a target of a refresh operation among the plurality of memory blocks BLK_1, BLK_2, BLK_3, . . . , BLK_N−2, BLK_N−1 and BLK_N included in the memory device 110, based on the first information INFO_1.

The memory controller 120 may execute the refresh operation on the target memory block. The fact that the refresh operation is executed on the target memory block means that valid data stored in the target memory block is rewritten to another memory block other than the target memory block. After the refresh operation on the target memory block is executed, the target memory block may be erased.

For example, in FIG. 4, the memory controller 120 may determine, as target memory blocks, the second memory block BLK_2 and the (N−1)ˆth memory block BLK_N−1, on which the reference operation REF_OP is not performed during the target time period among the plurality of memory blocks BLK_1, BLK_2, BLK_3, . . . , BLK_N−2, BLK_N−1 and BLK_N, and may execute the refresh operation on the determined target memory blocks.

The reason why, as such, the memory controller 120 executes a refresh operation only on a specific target memory block based on the first information INFO_1 is as follows.

In order to secure reliability of data stored in a memory device, the memory controller 120 may execute a refresh operation on all or a part of a plurality of memory blocks included in the memory device. The memory controller 120 may execute the refresh operation on only a memory block which is determined to require a refresh operation, or may execute the refresh operation on all memory blocks.

If the memory controller 120 executes the refresh operation without considering a time point at which data is written to a memory block, the refresh operation may be executed on a memory block shortly after the memory block is erased and data is written to the memory block. If, in this way, the refresh operation is executed even for a memory block which has been recently erased and thus has no problem in terms of reliability, a problem may resultantly occur in that the number of executions of unnecessary refresh operations excessively increases.

Therefore, in the embodiment of the present technology, the memory controller 120 of the memory system 100 may allow the refresh operation to be executed on only a memory block on which the refresh operation needs to be executed, thereby preventing an issue in which the lifetime of the memory system 100 is shortened due to excessive refresh operations.

The schematic operation of the memory system 100 described above will be described through detailed examples.

First, a detailed example in which the memory system 100 configures the first information INFO_1 will be described. Hereinafter, the detailed example in which the memory system 100 configures the first information INFO_1 will be described with reference to FIGS. 5 and 6.

Figure 5:
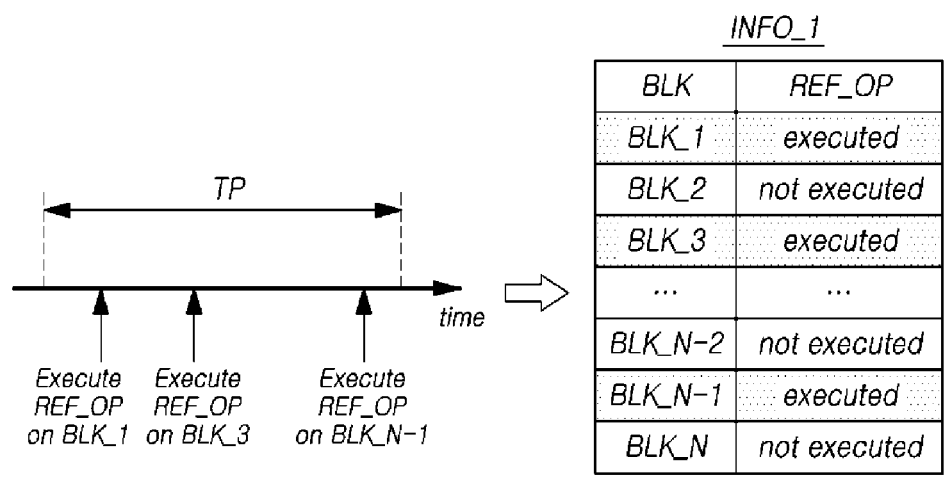
FIG. 5 is a diagram illustrating an example in which the memory system based on the embodiment of the disclosed technology configures first information.

FIG. 5 is a diagram illustrating an example in which the memory system 100 based on the embodiment of the disclosed technology configures the first information INFO_1.

Referring to FIG. 5, the memory controller 120 of the memory system 100 may monitor whether the reference operation REF_OP is executed on the plurality of memory blocks BLK_1, BLK_2, BLK_3, ..., BLK_N−2, BLK_N−1 and BLK_N during a target time period TP.

In FIG. 5, during the target time period TP, the reference operation REF_OP is executed on the first memory block BLK_1 among the plurality of memory blocks BLK_1, BLK_2, BLK_3, ..., BLK_N−2, BLK_N−1 and BLK_N, the reference operation REF_OP is executed on the third memory block BLK_3 and the reference operation REF_OP is executed on the (N−1)^th memory block BLK_N−1.

In this case, the memory controller 120 may configure the first information INFO_1 to indicate that the reference operations REF_OP have been performed on the first memory block BLK_1, the third memory block BLK_3 and the (N−1)^th memory block BLK_N−1 and no reference operation REF_OP has been executed on the remaining memory blocks.

FIG. 6 is a diagram illustrating an example in which the first information INFO_1 illustrated in FIG. 5 is managed as a bitmap based on the embodiment of the disclosed technology.

Referring to FIG. 6, the memory controller 120 of the memory system 100 may manage the first information INFO_1 as a bitmap. The bitmap may include bits corresponding to the plurality of memory blocks BLK_1, BLK_2, BLK_3, ..., BLK_N−2, BLK_N−1 and BLK_N, respectively.

The memory controller 120 may set each bit of the bitmap to a first value (e.g., 0) upon initialization, and, when the reference operation REF_OP on a memory block has ever been executed during the target time period TP, may set a value of a bit, corresponding to the corresponding memory block in the bitmap, to a second value (e.g., 1).

For example, in FIG. 6, in the case where a value of a bit included in the bitmap is 0, the corresponding bit indicates that reference operation REF_OP on a memory block corresponding to the corresponding bit has never been executed during the target time period TP. Conversely, in the case where a value of a bit included in the bitmap is 1, the corresponding bit indicates that the reference operation REF_OP on a memory block corresponding to the corresponding bit has been executed during the target time period TP.

When observing the bitmap of FIG. 6, a value of a bit corresponding to the second memory block BLK_2 is 1, and a value of a bit corresponding to the (N−1)^th memory block BLK_N−1 is 1. Hence, the bitmap of FIG. 6 indicates that the reference operations REF_OP have been executed on the second memory block BLK_2 and the (N−1)^th memory block BLK_N−1 during the target time period TP.

Furthermore, the memory controller 120 of the memory system 100 may check second information INFO_2 in addition to the first information INFO_1.

The second information INFO_2 is information indicating, for each of the plurality of memory blocks BLK_1, BLK_2, BLK_3, ..., BLK_N−2, BLK_N−1 and BLK_N, a total erase/write count TOTAL_EW_CNT for the plurality of memory blocks BLK_1, BLK_2, BLK_3, ..., BLK_N−2, BLK_N−1 and BLK_N, at a latest time point at which the reference operation REF_OP on each memory block is executed, that is, a time point at which the reference operation REF_OP on each memory block is lastly executed. The total erase/write count TOTAL_EW_CNT for the plurality of memory blocks BLK_1, BLK_2, BLK_3, ..., BLK_N−2, BLK_N−1 and BLK_N means the accumulated number of erase/write times when an erase operation is executed on any of the plurality of memory blocks BLK_1, BLK_2, BLK_3, ..., BLK_N−2, BLK_N−1 and BLK_N after a specific reference time point and then data is written.

The memory controller 120 may determine a refresh operation execution sequence for at least one target memory block as a target of the refresh operation among the plurality of memory blocks BLK_1, BLK_2, BLK_3, ..., BLK_N−2, BLK_N−1 and BLK_N included in the memory device 110, based on the second information INFO_2.

Figure 7:
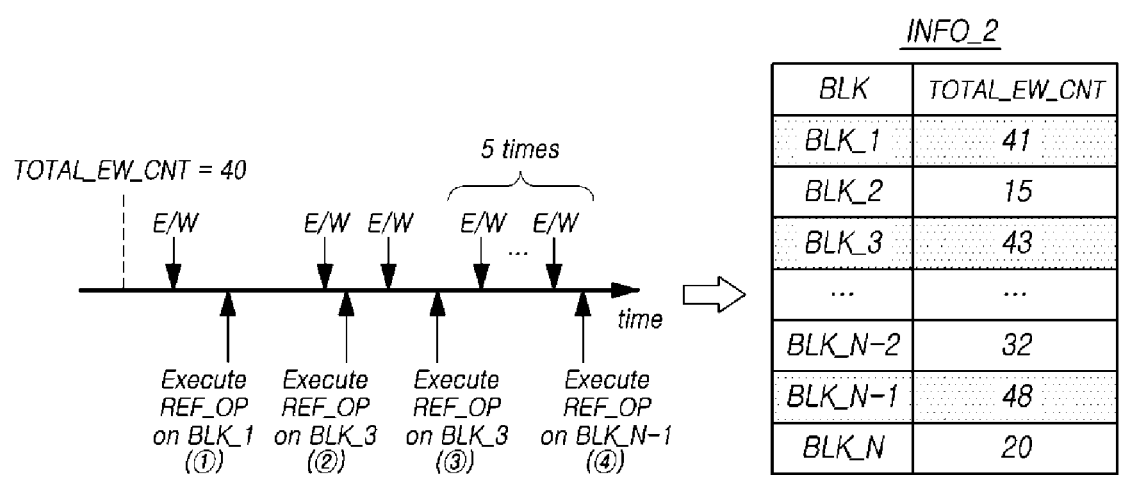
FIG. 7 is a diagram illustrating an example in which the memory system based on the embodiment of the disclosed technology configures second information.

FIG. 7 is a diagram illustrating an example in which the memory system 100 based on the embodiment of the disclosed technology configures the second information INFO_2.

Referring to FIG. 7, the memory controller 120 of the memory system 100 may calculate, for the plurality of memory blocks BLK_1, BLK_2, BLK_3, ..., BLK_N−2, BLK_N−1 and BLK_N, the total erase/write count TOTAL_EW_CNT for the plurality of memory blocks BLK_1, BLK_2, BLK_3, ..., BLK_N−2, BLK_N−1 and BLK_N, at a latest time point at which the reference operation REF_OP is executed on each memory block. The total erase/write count TOTAL_EW_CNT may be set as a value that is accumulated without being initialized again after being initialized once.

In FIG. 7, the total erase/write count TOTAL_EW_CNT at an initial time point is 40.

Further, 1), after the initial time point, an erase/program operation has occurred once before the reference operation REF_OP on the first memory block BLK_1 is executed (①), 2) an erase/program operation has occurred once before, after the time point (①), the reference operation REF_OP on the third memory block BLK_3 is executed for the first time (②), 3) an erase/program operation has occurred once before, after the time point (②), the reference operation REF_OP on the third memory block BLK_3 is executed for the second time (②), and 4) an erase/program operation has occurred five times before, after the time point (③), the reference operation REF_OP on the (N−1)^th memory block BLK_N−1 is executed (④).

In this case, the total erase/write count TOTAL_EW_CNT is 40+1=41 at a latest time point at which the reference operation REF_OP is executed on the first memory block BLK_1.

The total erase/write count TOTAL_EW_CNT is 41+2=43 at a latest time point at which the reference operation REF_OP is executed on the third memory block BLK_3. This is because not the time point (②) at which the reference operation REF_OP on the third memory block BLK_3 is executed for the first time but the time point (③) at which the reference operation REF_OP on the third memory block BLK_3 is lastly executed serves as a reference.

The total erase/write count TOTAL_EW_CNT is 43+5=48 at a latest time point at which the reference operation REF_OP is executed on the (N−1)^th memory block BLK_N−1.

FIG. 8 is a diagram illustrating an example in which the second information INFO_2 illustrated in FIG. 7 is managed as a table, based on the embodiment of the disclosed technology.

Referring to FIG. 8, the memory controller 120 of the memory system 100 may manage the second information INFO_2 as a table including table entries TBL_ENTRY corresponding to the plurality of memory blocks BLK_1, BLK_2, BLK_3, . . . , BLK_N−2, BLK_N−1 and BLK_N, respectively. Each table entry TBL_ENTRY may include a value of the total erase/write count TOTAL_EW_CNT at a latest time point at which the reference operation REF_OP is executed on a memory block corresponding to the corresponding table entry TBL_ENTRY.

For example, in FIG. 8, 1) a value of the total erase/write count TOTAL_EW_CNT included in the table entry TBL_ENTRY corresponding to the first memory block BLK_1 is 30, 2) a value of the total erase/write count TOTAL_EW_CNT included in the table entry TBL_ENTRY corresponding to the second memory block BLK_2 is 40, 3) a value of the total erase/write count TOTAL_EW_CNT included in the table entry TBL_ENTRY corresponding to the third memory block BLK_3 is 20, 4) a value of the total erase/write count TOTAL_EW_CNT included in the table entry TBL_ENTRY corresponding to the (N−2)^th memory block BLK_N−2 is 25, 5) a value of the total erase/write count TOTAL_EW_CNT included in the table entry TBL_ENTRY corresponding to the (N−1)^th memory block BLK_N−1 is 35, and 6) a value of the total erase/write count TOTAL_EW_CNT included in the table entry TBL_ENTRY corresponding to the N^th memory block BLK_N is 50.

In the above, detailed examples in which the memory system 100 configures the first information INFO_1 and the second information INFO_2 were described.

Hereinafter, an example in which the memory system 100 determines a target memory block will be described.

As described above, the reference operation REF_OP may be a specific operation that can be executed by the memory controller 120. For example, the reference operation REF_OP may be a read operation or an erase operation.

First, an example in which the memory system 100 determines a target memory block when the reference operation REF_OP is an erase operation will be described.

Figure 9:
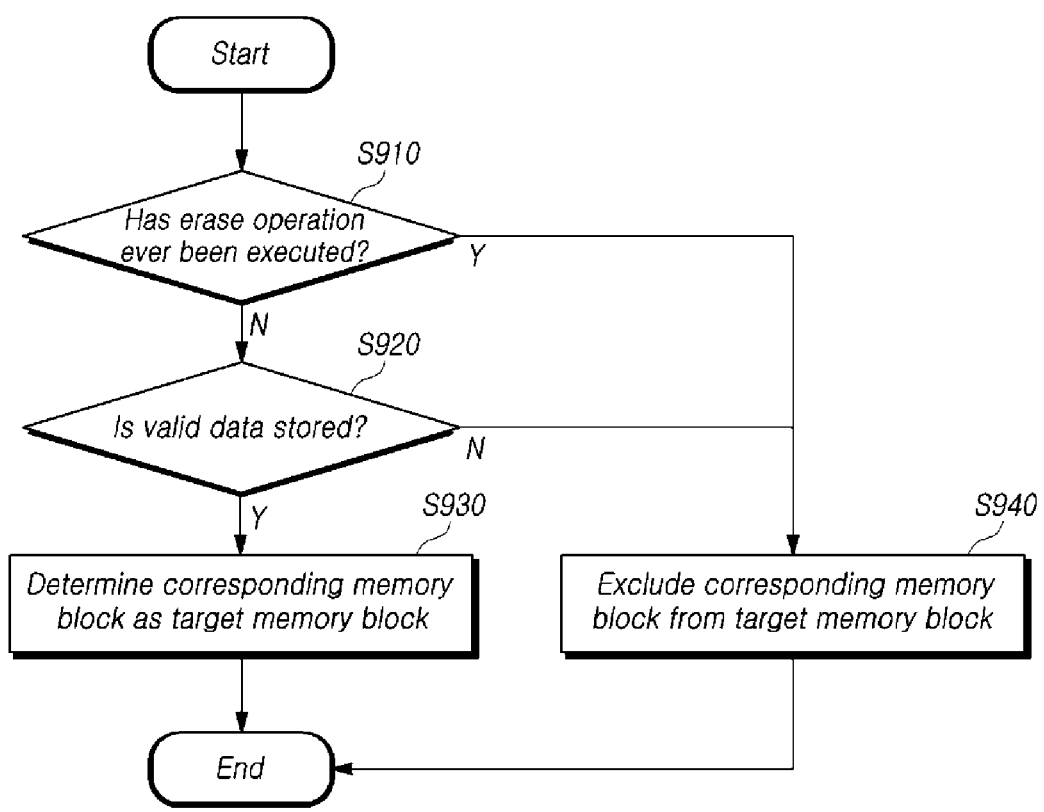
FIG. 9 is a diagram illustrating an example in which the memory system based on the embodiment of the disclosed technology determines a target memory block.

FIG. 9 is a diagram illustrating an example in which the memory system 100 based on the embodiment of the disclosed technology determines a target memory block.

Referring to FIG. 9, the memory controller 120 of the memory system 100 determines whether an erase operation on a memory block as an object for determination of a target memory block has ever been executed during a target time period (S910). The memory controller 120 may determine whether the erase operation on the corresponding memory block has ever been executed during the target time period, based on the above-described first information INFO_1.

When the erase operation on the corresponding memory block has never been performed during the target time period (S910-N), the memory controller 120 determines whether valid data is stored in the corresponding memory block (S920).

When valid data is stored in the corresponding memory block (S920-Y), the memory controller 120 may determine the corresponding memory block as a target memory block (S930). The reason for this is that, since the erase operation on the corresponding memory block has never been executed during the target time period, there is a possibility that an error may occur in the stored valid data, and therefore, the memory controller 120 needs to secure the reliability of the stored valid data.

Conversely, when the erase operation on the corresponding memory block has ever been executed during the target time period (S910-Y) or when no valid data is stored in the corresponding memory block even though the erase operation on the corresponding memory block has never been executed during the target time period (S920-N), the memory controller 120 may exclude the corresponding memory block from a target memory block (S940). The reason for this is that, since the erase operation on the corresponding memory block has already been executed during the target time period, there is a low possibility that an error may occur in stored valid data, and, when no valid data exists in the corresponding memory block, data stored in the corresponding memory block is not accessed by a host and thus it is not necessary to secure the reliability of the stored data.

In the embodiment of the disclosed technology, the memory controller 120 may perform the operation, described just above with reference to FIG. 9, on each of the plurality of memory blocks BLK_1, BLK_2, BLK_3, . . . , BLK_N−2, BLK_N−1 and BLK_N, and thereby, may determine at least one target memory block among the plurality of memory blocks BLK_1, BLK_2, BLK_3, . . . , BLK_N−2, BLK_N−1 and BLK_N.

Hereinafter, description will be made for a sequence in which the memory controller 120 executes refresh operations on determined target memory blocks.

Figure 10:
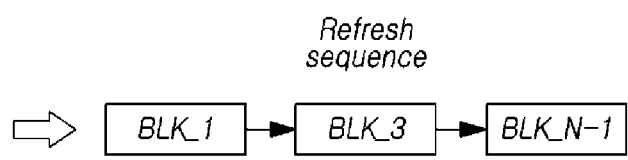
FIG. 10 is a diagram illustrating an example of a sequence in which refresh operations are executed on target memory blocks determined in FIG. 9, based on the embodiment of the disclosed technology.

FIG. 10 is a diagram illustrating an example of a sequence in which refresh operations are executed on target memory blocks determined in FIG. 9, based on the embodiment of the disclosed technology.

Referring to FIG. 10, the memory controller 120 of the memory system 100 may execute a refresh operation on a target memory block according to order in which a value of the total erase/write count TOTAL_EW_CNT is small. That is, the sequence of the refresh operation to be performed on plural target memory blocks may be arranged in an ascending order of the total erase/write count TOTAL_EW_CNT. Accordingly, the memory controller 120 may first execute a refresh operation on a memory block which has a smaller value of the corresponding total erase/write count TOTAL_EW_CNT, among target memory blocks, and may subsequently execute a refresh operation on a memory block which has a greater value of the corresponding total erase/write count TOTAL_EW_CNT, among the target memory blocks. The memory controller 120 may check a value of the total erase/write count TOTAL_EW_CNT through the above-described second information INFO_2.

For example, in FIG. 10, the first memory block BLK_1, the third memory block BLK_3 and the (N−1)^th memory block BLK_N−1 are determined as target memory blocks and corresponding total erase/write counts TOTAL_EW_CNT are 41, 43 and 48, respectively.

In FIG. 10, the memory controller 120 may first execute a refresh operation on the first memory block BLK_1 whose total erase/write count TOTAL_EW_CNT is 41 as a smallest value, among the target memory blocks, may next execute a refresh operation on the third memory block BLK_3 whose total erase/write count TOTAL_EW_CNT is 43, and may lastly execute a refresh operation on the (N−1)^th memory block BLK_N−1 whose total erase/write count TOTAL_EW_CNT is 48.

In the above, an operation in which the memory system 100 determines a target memory block and a sequence in which refresh operations on target memory blocks are executed, was described.

Hereinafter, description will be made for contents in which the memory system 100 initializes the first information INFO_1 after completing a refresh operation on a target memory block.

Figure 11:
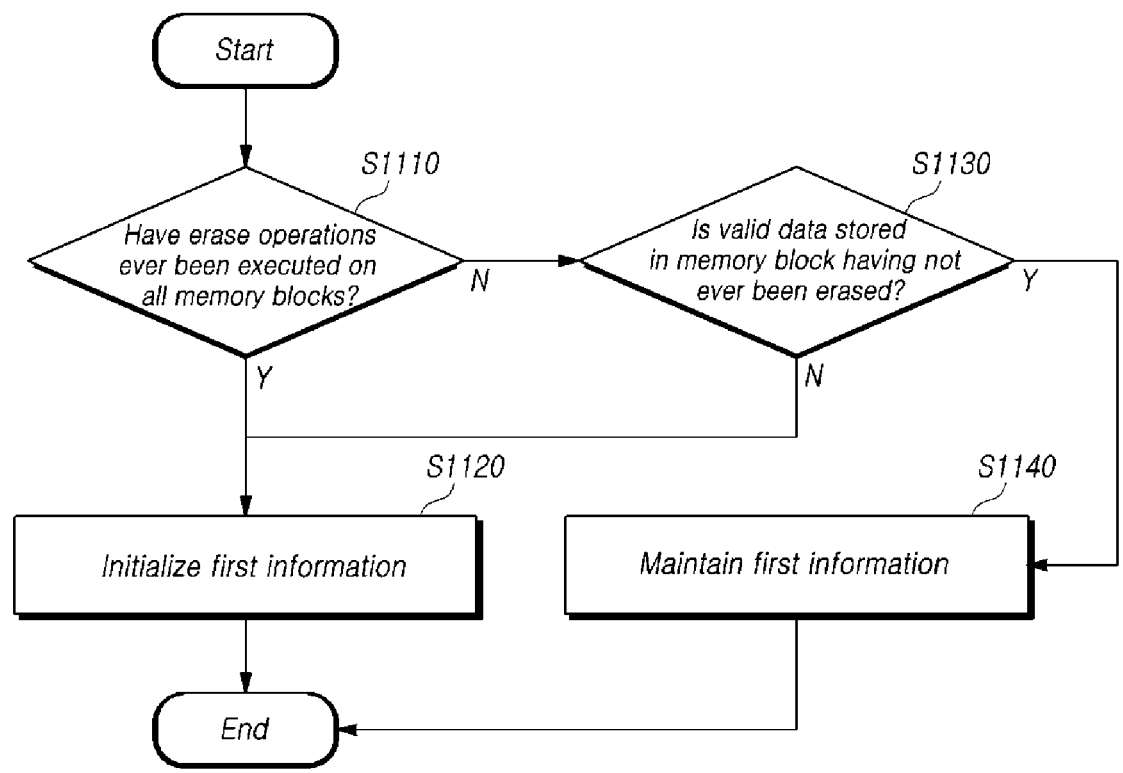
FIG. 11 is a diagram illustrating an example of an operation in which the memory system based on the embodiment of the disclosed technology initializes the first information.

FIG. 11 is a diagram illustrating an example of an operation in which the memory system 100 based on the embodiment of the disclosed technology initializes the first information INFO_1.

Referring to FIG. 11, the memory controller 120 of the memory system 100 determines whether all of the plurality of memory blocks BLK_1, BLK_2, BLK_3, . . . , BLK_N−2, BLK_N−1 and BLK_N have ever been erased during a target time period (S1110).

When all of the plurality of memory blocks BLK_1, BLK_2, BLK_3, . . . , BLK_N−2, BLK_N−1 and BLK_N have ever been erased during the target time period (S1110-Y), the memory controller 120 may initialize the information INFO_1 (S1120). The reason for this is that, since all memory blocks have ever been erased, it may be regarded that the reliability of data stored in all the memory blocks has been secured.

Conversely, when a memory block which has never been erased during the target time period exists among the plurality of memory blocks BLK_1, BLK_2, BLK_3, . . . , BLK_N−2, BLK_N−1 and BLK_N (S1110-N), the memory controller 120 determines whether valid data is stored in the memory block which has never been erased during the target time period (S1130).

When valid data is not stored in the memory block which has never been erased during the target time period (S1130-N), the memory controller 120 may initialize the first information INFO_1 (S1120). The reason for this is that, since data stored in the memory block which has never been erased during the target time period is not valid, there is no need to secure the reliability of the corresponding data.

Conversely, when valid data is stored in the memory block which has never been erased during the target time period (S1130-Y), the memory controller 120 may not initialize the first information INFO_1 and maintains the first information INFO_1 as it is (S1140). The reason for this is that, since data stored in the memory block which has never been erased during the target time period may be accessed by the host, there is a need to secure the reliability of the corresponding data.

In the above, an example in which the memory system 100 determines a target memory block when the reference operation REF_OP is an erase operation was described.

Hereunder, an example in which the memory system 100 determines a target memory block when the reference operation REF_OP is a read operation will be described.

Figure 12:
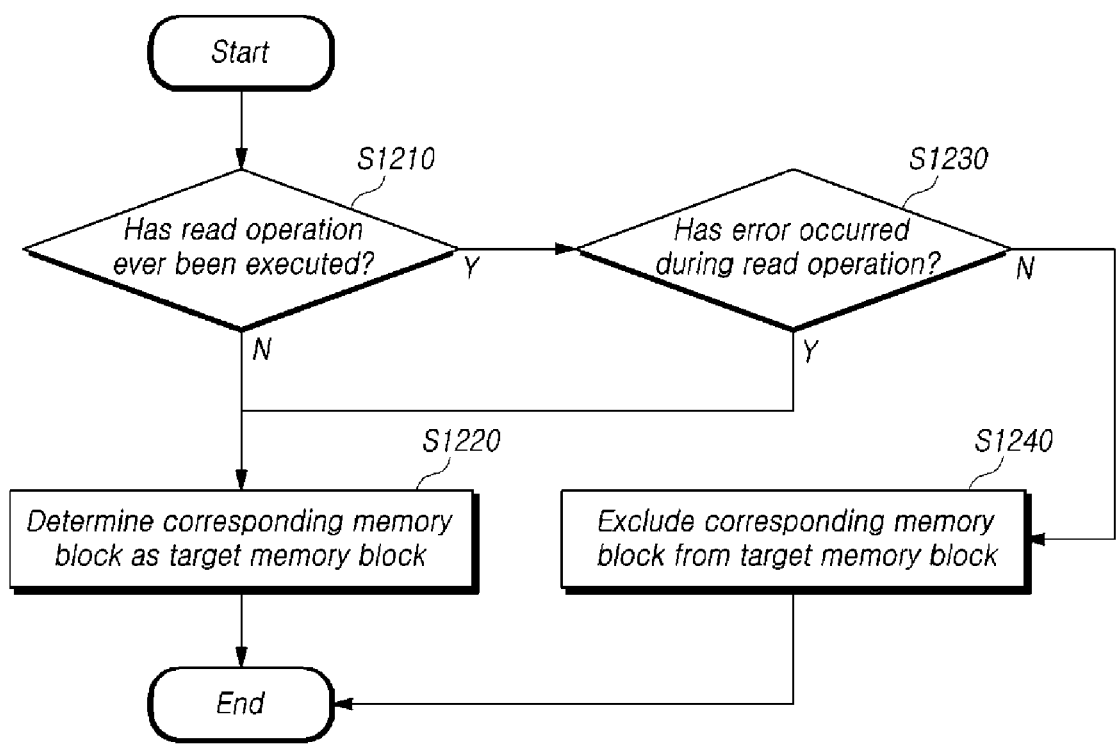
FIG. 12 is a diagram illustrating another example in which the memory system based on the embodiment of the disclosed technology determines a target memory block.

FIG. 12 is a diagram illustrating another example in which the memory system 100 based on the embodiment of the disclosed technology determines a target memory block.

Referring to FIG. 12, the memory controller 120 of the memory system 100 determines whether a read operation on a memory block has ever been executed during a target time period, based on the above-described first information INFO_1 (S1210).

When the read operation on the corresponding memory block has never been executed during the target time period (S1210-N), the memory controller 120 may determine the corresponding memory block as a target memory block (S1220). The reason for this is that, since the read operation on the corresponding memory block has never been executed during the target time period, the reliability of data stored in the corresponding memory block cannot be guaranteed.

Conversely, when the read operation on the corresponding memory block has ever been executed during the target time period (S1210-Y), the memory controller 120 determines whether an error has ever occurred during the read operation executed on the corresponding memory block during the target time period (S1230).

When an error has ever occurred during the read operation executed on the corresponding memory block during the target time period (S1230-Y), the memory controller 120 may determine the corresponding memory block as a target memory block (S1220). The reason for this is that, since there is a high possibility that an error may exist in data stored in the corresponding memory block, there is a need to perform an operation for securing the reliability of the data stored in the corresponding memory block.

The memory controller 120 may get an error information that an error has ever occurred during the read operation executed on the corresponding memory block during the target time period, from the memory device 110 through a response to the read operation. The error information may be included in the first information INFO_1.

Conversely, when an error has never occurred during the read operation executed on the corresponding memory block during the target time period (S1230-N), the memory controller 120 may exclude the corresponding memory block from a target memory block (S1240). The reason for this is that, since there is a low possibility that an error may exist in data stored in the corresponding memory block, it is expected that the reliability of the data stored in the corresponding memory block is high.

Figure 13:
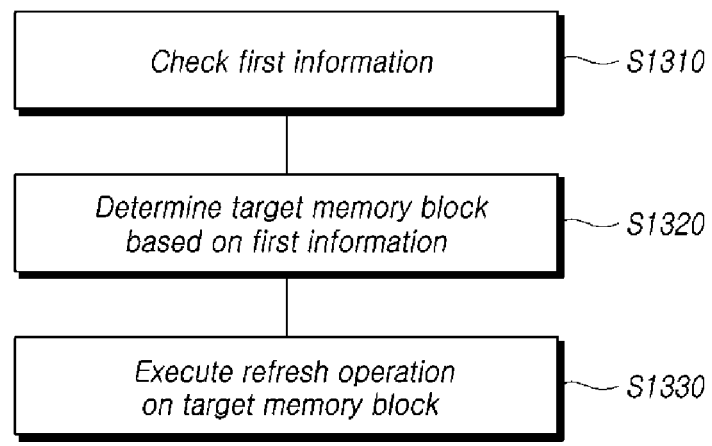
FIG. 13 is a diagram illustrating a method for operating the memory system based on the embodiment of the disclosed technology.

FIG. 13 is a diagram illustrating a method for operating the memory system 100 based on the embodiment of the disclosed technology.

Referring to FIG. 13, the method for operating the memory system 100 may include checking the first information INFO_1 (S1310).

The first information INFO_1 is information indicating an execution state of a reference operation on each of a plurality of memory blocks included in the memory device 110 during a preset target time period.

The method for operating the memory system 100 may include determining, based on the first information INFO_1, at least one target memory block, among the plurality of memory blocks, as a target of a refresh operation (S1320). The refresh operation is an operation of rewriting stored data.

The method for operating the memory system 100 may include executing a refresh operation on the target memory block (S1330).

The above-described reference operation may be an erase operation or a read operation.

As an example, when the reference operation is an erase operation, the operation S1320 may determine, as a target memory block, a memory block 1) on which an erase operation has never been executed during a target time period and 2) in which valid data is stored, among the plurality of memory blocks.

The first information INFO_1 may be initialized when 1) all of the plurality of memory blocks have ever been erased during the target time period or 2) no valid data is stored in a memory block which has never been erased during the target time period among the plurality of memory blocks.

As another example, when the reference operation is a read operation, the operation S1320 may determine, as a target memory block, a memory block 1) on which a read operation has never been executed during a target time period or 2) in which an error has ever occurred during a read operation executed during the target time period, among the plurality of memory blocks.

The method for operating the memory system 100 may further include additionally checking, for each of the plurality of memory blocks, the second information INFO_2 indicating a total erase/write count for the plurality of memory blocks at a latest time point when the reference operation on each memory block has been executed, and determining a sequence in which refresh operations on target memory blocks are executed, based on the second information INFO_2. In this case, a refresh operation on a target memory block may be executed according to order in which a value of the total erase/write count is small.

In some implementations, the operation of the memory controller 120 described above may be controlled by the control circuit 123, and may be performed in such a manner that the processor 124 executes (drives) firmware in which the overall operation of the memory controller 120 is programmed.

Figure 14:
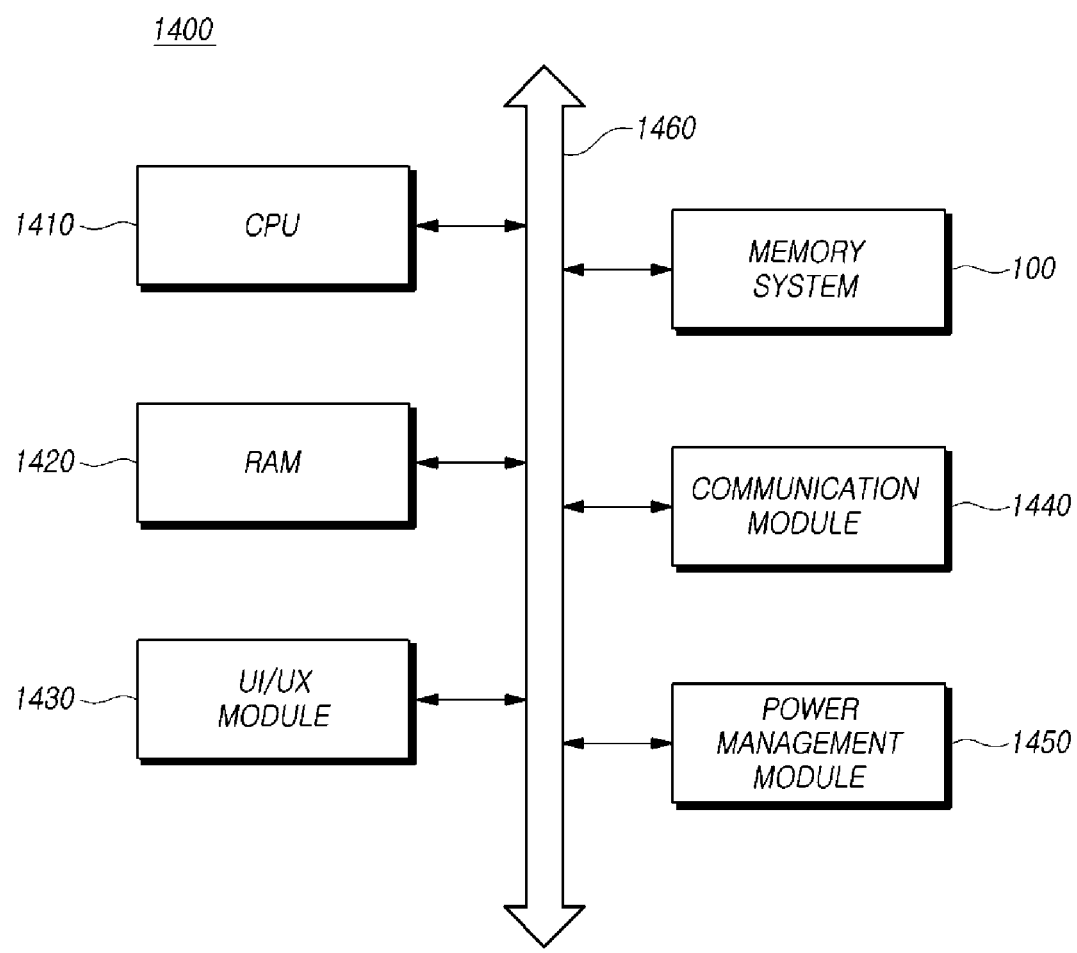
FIG. 14 is a diagram illustrating the configuration of a computing system based on some embodiments of the disclosed technology.

FIG. 14 is a diagram illustrating the configuration of a computing system 1400 based on an embodiment of the disclosed technology.

Referring to FIG. 14, the computing system 1400 based on an embodiment of the disclosed technology may include: a memory system 100 electrically connected to a system bus 1460; a CPU 1410 configured to control the overall operation of the computing system 1400; a RAM 1420 configured to store data and information related to operations of the computing system 1400; a user interface/user experience (UI/UX) module 1430 configured to provide the user with a user environment; a communication module 1440 configured to communicate with an external device as a wired and/or wireless type; and a power management module 1450 configured to manage power used by the computing system 1400.

The computing system 1400 may be a personal computer (PC) or may include a mobile terminal such as a smartphone, a tablet or various electronic devices.

The computing system 1400 may further include a battery for supplying an operating voltage, and may further include an application chipset, a graphic-related module, a camera image processor, and a DRAM. Other elements would be apparent to a person skilled in the art.

The memory system 100 may include not only a device configured to store data in a magnetic disk such as a hard disk drive (HDD), but also a device configured to store data in a nonvolatile memory such as a solid state drive (SSD), a universal flash storage device, or an embedded MMC (eMMC) device. The non-volatile memory may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. In addition, the memory system 100 may be implemented as storage devices of various types and mounted inside various electronic devices.

Based on embodiments of the disclosed technology described above, the operation delay time of the memory system may be advantageously reduced or minimized. In addition, based on an embodiment of the disclosed technology, an overhead occurring in the process of calling a specific function may be advantageously reduced or minimized. Although various embodiments of the disclosed technology have been described with particular specifics and varying details for illustrative purposes, those skilled in the art will appreciate that various modifications, additions and substitutions may be made based on what is disclosed or illustrated in the present disclosure without departing from the spirit and scope of the invention as defined in the following claims.

What is claimed is:

1. A memory system comprising:
    a memory device including a plurality of memory blocks; and
    a memory controller configured to communicate with the memory device, and control the memory device,
    wherein the memory controller further:
    checks first information indicating an execution state of a reference operation on each of the memory blocks during a preset target time period,
    determines, based on the first information, at least one target memory block storing valid data, among the plurality of memory blocks, as a target of a refresh operation of rewriting data stored in the target memory block, and
    executes a refresh operation on the target memory block,
    wherein the reference operation is an erase operation or a read operation, and
    wherein, when the reference operation is an erase operation, the memory controller determines prior to the refresh operation, as the target memory block, a memory block on which an erase operation has never been executed during the target time period and in which the valid data is stored among the plurality of memory blocks,
    wherein the memory controller further:
    checks, for each of the plurality of memory blocks, second information indicating a total erase/write count for the plurality of memory blocks at a latest time point when the reference operation on each memory block has been executed, and determines a sequence in which refresh operations on the target memory blocks are executed based on the second information, and wherein the memory controller executes the refresh operations on the target memory blocks according to the sequence.

2. The memory system according to claim 1, wherein the memory controller further manages the first information as a bitmap including bits respectively corresponding to the plurality of memory blocks.

3. The memory system according to claim 1, wherein the memory controller further initializes the first information when all of the plurality of memory blocks have ever been erased during the target time period or no valid data is stored in a memory block which has never been erased during the target time period among the plurality of memory blocks.

4. The memory system according to claim 1, wherein, when the reference operation is a read operation, the memory controller determines, as the target memory block, a memory block on which a read operation has never been executed during the target time period or a memory block on which an error has ever occurred during a read operation executed during the target time period, among the plurality of memory blocks.

5. The memory system according to claim 1, wherein the sequence is arranged in an ascending order of the total erase/write count.

6. The memory system according to claim 1, wherein the memory controller further manages the second information as a table including table entries respectively corresponding to the plurality of memory blocks.

7. A method for operating a memory system including a memory device including a plurality of memory blocks, the method comprising:

checking first information indicating an execution state of a reference operation on each of the memory blocks during a preset target time period;

determining, based on the first information, at least one target memory block storing valid data, among the plurality of memory blocks, as a target of a refresh operation of rewriting data stored in the target memory block;

executing a refresh operation on the target memory block, checking, for each of the plurality of memory blocks, second information indicating a total erase/write count for the plurality of memory blocks at a latest time point when the reference operation on each memory block has been executed; and determining a sequence in which refresh operations on target memory blocks are executed, based on the second information, and wherein the refresh operation is executed on the target memory block according to the sequence, and wherein the reference operation is an erase operation or a read operation, and wherein, when the reference operation is an erase operation, the determining of the target memory block includes determining prior to the refresh operation, as the target memory block, a memory block on which an erase operation has never been executed during the target time period and in which valid data is stored among the plurality of memory blocks.

8. The method according to claim 7, further comprising initializing the first information when all of the plurality of memory blocks have ever been erased during the target time period or no valid data is stored in a memory block which has never been erased during the target time period among the plurality of memory blocks.

9. The method according to claim 7, wherein, when the reference operation is a read operation, the determining of the target memory block includes determining, as the target memory block, a memory block on which a read operation has never been executed during the target time period or a memory block on which an error has ever occurred during a read operation executed during the target time period, among the plurality of memory blocks.

10. The method according to claim 7, wherein the sequence is arranged in an ascending order of the total erase/write count.

11. An operating method of a controller, the operating method comprising:

controlling a nonvolatile memory device to perform an erase operation on one or more memory blocks during a target time period; and controlling the nonvolatile memory device to perform a refresh operation on a target memory block storing valid data among the memory blocks, wherein the target memory block is determined prior to the refresh operation, wherein the erase operation is not performed on the target memory block during the target time period wherein the valid data is stored in the target memory block during the target time period and wherein the refresh operation is executed on the target memory blocks according to a sequence determined based on information indicating a total erase/write count for the one or more memory blocks at a latest time point when the erase operation on each of the one or more memory blocks has been executed.

12. An operating method of a controller, the operating method comprising:

controlling a nonvolatile memory device to perform a read operation on one or more memory blocks during target time period; and controlling the nonvolatile memory device to perform a refresh operation on a target memory block storing valid data among the memory blocks, wherein the target memory block is determined prior to the refresh operation, and wherein the target memory block is any of a memory block, on which the read operation is not performed during the target time period, and a memory block, on which an error occurs while the read operation is performed during the target time period, and wherein the refresh operation is executed on the target memory blocks according to a sequence determined based on information indicating a total erase/write count for the one or more memory blocks at a latest time point when the read operation on each of the one or more memory blocks has been executed.

\* \* \* \* \*